US 6,718,284 B2

(12) United States Patent
Smith et al.

(10) Patent No.: US 6,718,284 B2
(45) Date of Patent: Apr. 6, 2004

(54) SMART MODULE AND ADAPTER APPARATUS

(75) Inventors: Paul S. Smith, Salt Lake City, UT (US); Jon Alan Bertrand, Taylorsville, UT (US)

(73) Assignee: Cirris Systems Corporation, Salt Lake City, UT (US)

( * ) Notice: Subject to any disclaimer, the term of this patent is extended or adjusted under 35 U.S.C. 154(b) by 233 days.

(21) Appl. No.: 10/060,155

(22) Filed: Jan. 30, 2002

(65) Prior Publication Data

US 2003/0144817 A1 Jul. 31, 2003

(51) Int. Cl.[7] .............................................. G01R 31/02
(52) U.S. Cl. ........................ 702/183; 455/423; 324/500
(58) Field of Search ............................ 702/183, 57, 58, 702/59, 61, 62, 79, 80, 117, 182, 184, 189; 455/423, 67.11, 115.1, 226.1; 324/500, 512, 522, 524, 535; 700/28, 35, 174

(56) References Cited

U.S. PATENT DOCUMENTS

| 4,104,586 A | 8/1978 | Newbould et al. ............ 324/83 |
| 5,414,343 A | 5/1995 | Flaherty et al. ............... 324/66 |
| 5,420,987 A | 5/1995 | Reid et al. ................... 395/325 |

*Primary Examiner*—Marc S. Hoff
*Assistant Examiner*—Edward Raymond
(74) *Attorney, Agent, or Firm*—Madson & Metcalf

(57) ABSTRACT

A smart module is disclosed for use in testing equipment such as cables and wire harnesses. The smart module may be incorporated within an adapter that interfaces with a test device and a wiring analyzer. The smart module includes a processor and a memory wherein data relating to the adapter may be stored. The smart module further includes first and second inputs that enable synchronous, bi-directional communication with the wiring analyzer. The smart module receives power, clock, communication data, and a reference input from the wiring analyzer and transmits data stored in the memory. The smart module may further include one or more visual indicators, such as LEDs, for displaying conditions of an interface between the adapter and a test device.

35 Claims, 4 Drawing Sheets

SMART MODULE AND ADAPTER APPARATUS

BACKGROUND

1. The Field of the Invention

The present invention relates to electrical interconnection test equipment and, more specifically, the invention relates to adapters interfacing with one or more connectors and a wiring analyzer.

2. The Background Art

Cables and harnesses are in common use to interconnect various components of electrical devices. Interconnection enables communication between devices such as a computer and a peripheral device. Cables and harnesses come in various configurations to provide compatibility for the different types of devices. Cables and harnesses are tested during and after manufacturing to ensure proper continuity and the absence of short circuits. Additional tests may also be performed to ensure that the cable or harness will operate as intended in a given application. The equipment that performs these tests is herein called a wiring analyzer.

A challenge in interfacing a wiring analyzer to a cable or wire harness is the identification of the connectors used in the interface and the salient features of the interface. It is important to know the order in which pins in the connector should be counted, the names of the pins in the connector, the number of mating cycles the connector can handle before excessive degradation, and so forth. This information is important in order to verify that two separate test setups can be used to test a cable or harness in a similar way. It would also expedite testing if a wiring analyzer can draw the operator's attention to the pins in the connector by lighting one or more indicators near the connector.

Accomplishing these tasks normally requires many extra connections to the wiring analyzer, which could otherwise have been used for testing additional wires in the assembly to be tested. One such method is the use of adapter strapping to identify an adapter type by an alphanumeric signature and is disclosed in U.S. Pat. No. 4,620,282 to Shelley, which is incorporated herein by reference. Another method is to include in the adapter one or more data storage devices which use only two wires for communication. This is complicated because such devices currently available, such as the memory tokens manufactured by Dallas Semiconductor, use communication protocols that will not readily adapt to capacitance common for test systems with large numbers of test points.

Thus, it would be an advancement in the art to provide information relating to the adapter to the wiring analyzer in an efficient and economic manner. It would be another advancement in the art to provide a communication protocol that uses electrical connections to meet the needs of large test systems that can be slow due to system capacitance. It would be a further advancement in the art to provide a protocol that provides a visual indication, such as by use of light emitting diodes (LEDs), to draw an operator's attention to a given connector or pin in a given connector. It would be another advancement in the art to retain a memory of connectors or pins that were previously indicated. Such a system and method are disclosed herein.

BRIEF SUMMARY

The invention is directed towards a device, hereinafter referred to as a smart module, which uses two electrical connections to receive power and clock signals from a wiring analyzer. The electrical connections further provide bi-directional data communication with the wiring analyzer. The smart module may be integrated within an adapter that interfaces one or more connectors to the wiring analyzer. The smart module is so called because it includes a processor or controller and a memory.

The wiring analyzer supplies power to the smart module by impressing a current and voltage across the two electrical connections. The wiring analyzer controls data flow to and from the smart module by issuing clock pulses to the smart module through the two connections. A clock pulse is created by forcing the voltage across the two connections to be reduced for a specified time and then restored. The wiring analyzer transmits data to the smart module while transmitting each clock pulse by varying the voltage supplied to the smart module during the clock pulse.

If voltage supplied during the clock pulse is less than a specified negative voltage, a data bit is interpreted to be of one state, otherwise it is interpreted to be of the other state. The smart module transmits data to the wiring analyzer by varying the load that it presents to the two connections to the wiring analyzer upon receiving a clock pulse from the wiring analyzer. The smart module transmits a data bit of one state by presenting a large load, and transmits a data bit of the other state by presenting a small load to the connections to the wiring analyzer. The data bit is presented continuously until the wiring analyzer presents another clock pulse to the smart module, or until the wiring analyzer reduces the power supplied to the smart module for a specified time. The communication protocol transmits data in the described manner to facilitate the use of smart modules in large test systems.

The smart module may also include one or more indicators, such as LEDs, that are in electrical communication with the processor. The wiring analyzer transmits a signal to the smart module that causes the smart module to divert power supplied by the wiring analyzer to a selected indicator.

The invention reduces the number of electrical connections required to store information about an adapter and an interface with a cable or wire harness. The invention further provides one or more indicators to draw an operator's attention to a given connector in an interface or pin in a given connector.

BRIEF DESCRIPTION OF THE DRAWINGS

In order that the manner in which the above-recited and other advantages and features of the invention are obtained, a more particular description of the invention summarized above will be rendered by reference to the appended drawings. Understanding that these drawings only provide selected embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

The presently preferred embodiments of the present invention will be best understood by reference to the drawings, wherein like parts are designated by like numerals throughout. It will be readily understood that the components of the present invention, as generally described and illustrated in the figures herein, could be arranged and designed in a wide variety of different configurations. Thus, the following more detailed description of the embodiments of the apparatus, system, and method of the present invention, as represented in FIGS. 1 through 4, is not intended to limit the scope of the invention, as claimed, but is merely representative of presently preferred embodiments of the invention.

Figure 1:
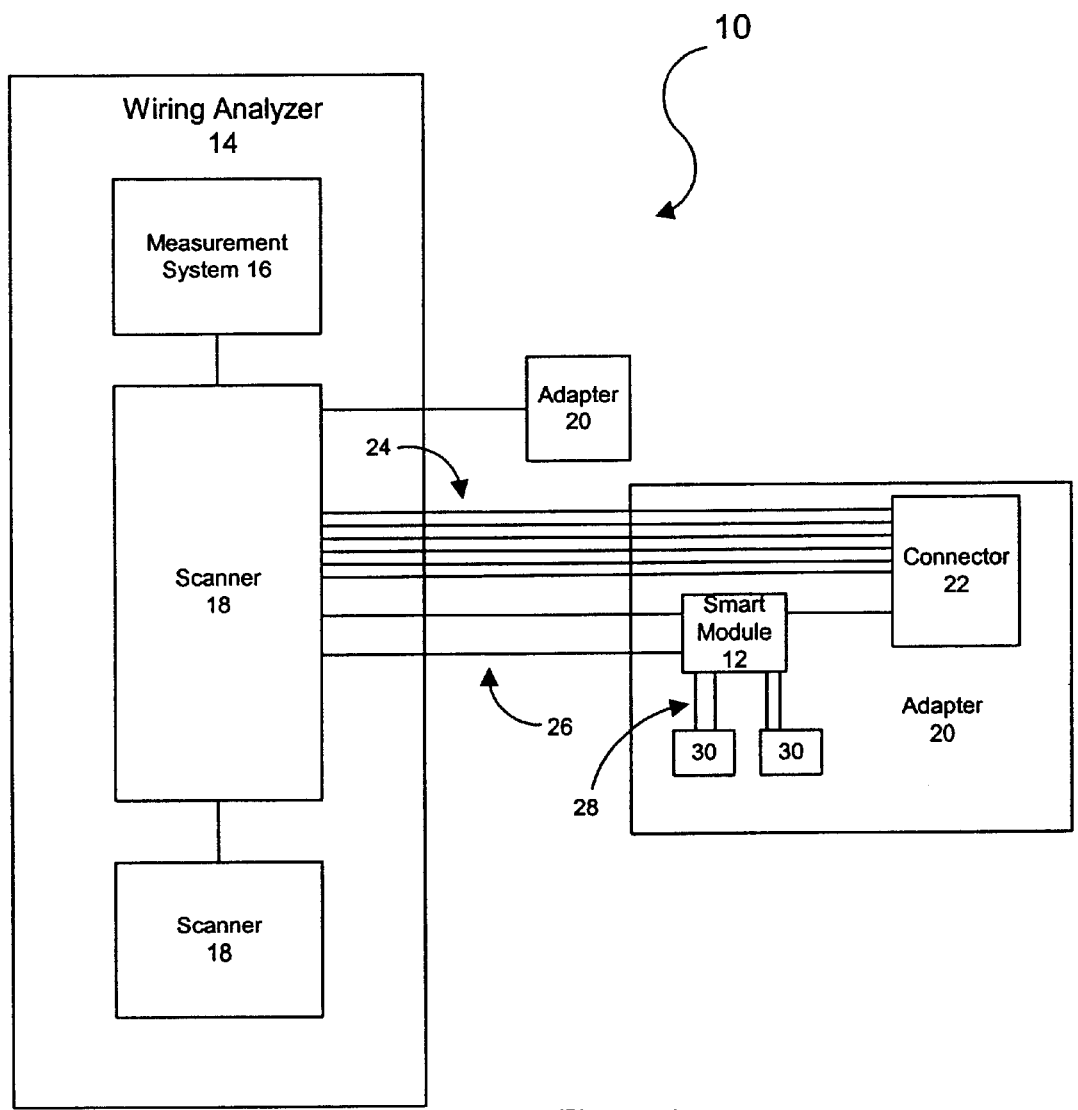
FIG. 1 is a block diagram illustrating an embodiment of a smart module in communication with an adapter and a wiring analyzer.

Referring to FIG. 1, one embodiment of a testing system 10 that includes a smart module 12 of the present invention. The system 10 further includes a wiring analyzer 14 having a conventional measurement system 16. The measurement system 16 is in electrical communication with one or more switching systems herein referenced as scanners 18. A scanner 18 interfaces with any one or more adapters 20 as is common in the art. Various adapters 20 may interface with a scanner 18 so that different types of connectors can interface with the wiring analyzer 14. An adapter 20 provides connectors 22 onto which a device to be tested may interface.

An adapter 20 of the system 10 includes the smart module 12 and may be referenced herein as a smart adapter. The smart module 12 is so named because it includes processing capability as well as a memory containing information about the adapter 20. The adapter 20 is in electrical communication with the scanner 18 through electrical connections 24. The adapter 20 may have two connections 26 to couple the smart module 12 to the scanner 18. One of the two connections 26 may also be connected to the connector 22. The two connections 26 provide Power, Clock, Data Out, and Data In (PCD) on a first line or PCD line and a Reference Input (RI) on a second line or RI line. The ground voltage for components in the smart module 12 is the RI and is not an earth ground. The wiring analyzer 14 creates a data bit one by forcing the connections 26 to a common voltage for a time duration, Tclk. The wiring analyzer 14 reverses the polarity of the connections 26 for Tclk to create a data bit zero.

The smart module 12 may have electrical connections 28 to one or more visual indicators 30 which can be used to draw the attention of the operator to the state of the connector 22 or to electrical contacts attached to the connector 22. The visual indicators 30 may be embodied as LEDs. By using visual indicators 30, an operator may review the conditions of pins in the connector 22 which expedites testing.

Figure 2:
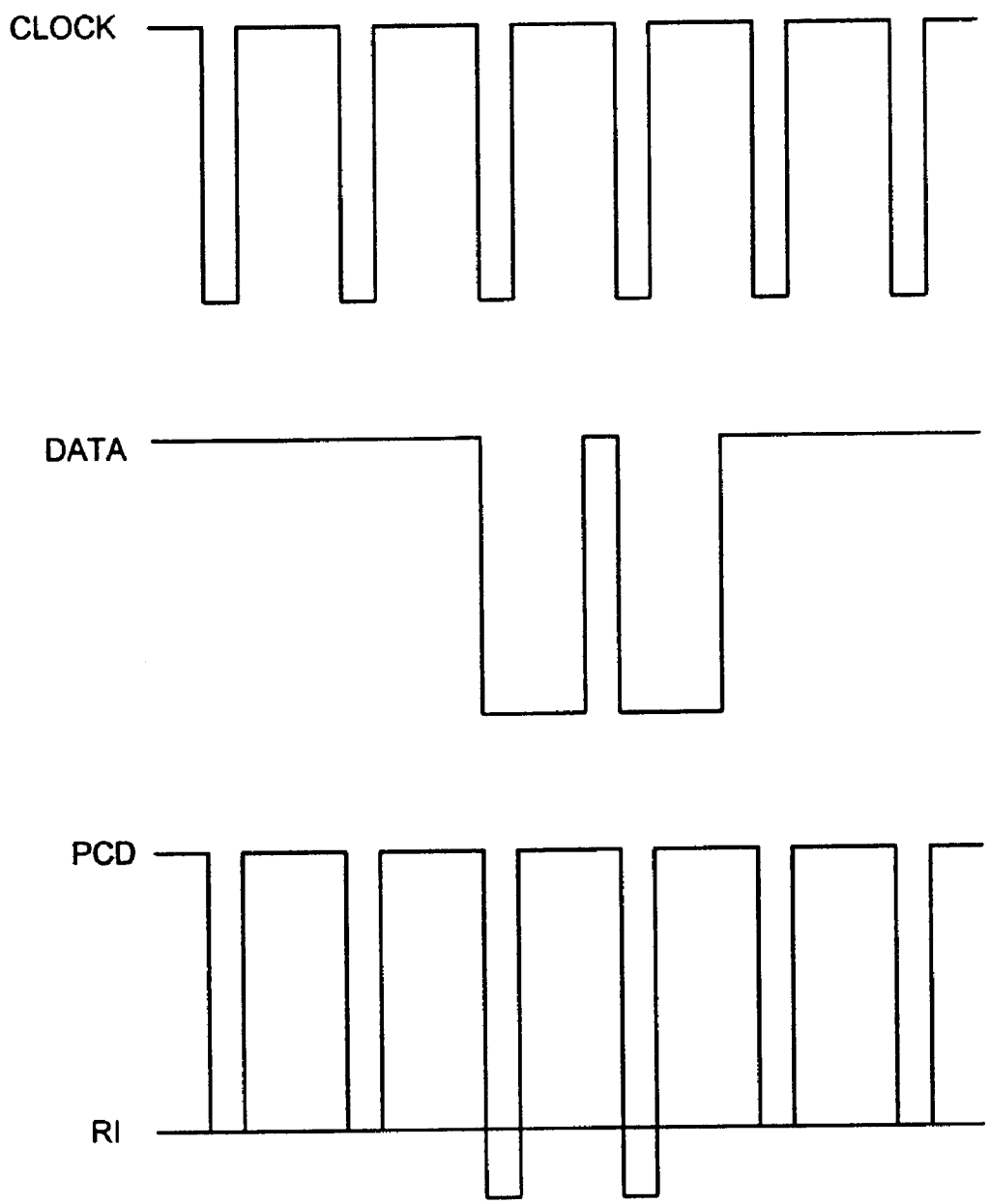
FIG. 2 is a timing diagram illustrating one method for transmitting data from a wiring analyzer to the smart module.

Referring to FIG. 2, a representative timing diagram illustrating data transmission from a wiring analyzer 14 to the smart module 12 is shown. The wiring analyzer 14 supplies power to the smart module 12 via a current source applied to the PCD line with respect to the RI line. Clock and a data bit representing a binary 1 are created by the wiring analyzer 14 by forcing the two connections 26 to a common voltage for a specified time, referred to herein as Tclk. Clock and a data bit representing a binary 0 are created by the wiring analyzer 14 by reversing the polarity of the two communication lines for Tclk. The number of data bits required to represent a command or data can be varied to optimize the communication rate.

As shown in FIG. 2, the smart module 12 does not receive power during a clock pulse. If a clock pulse is long enough, then the smart module 12 will not receive power and will shut down. The hold time between clock pulses has a specified minimum time duration but no specified maximum time.

Figure 3:
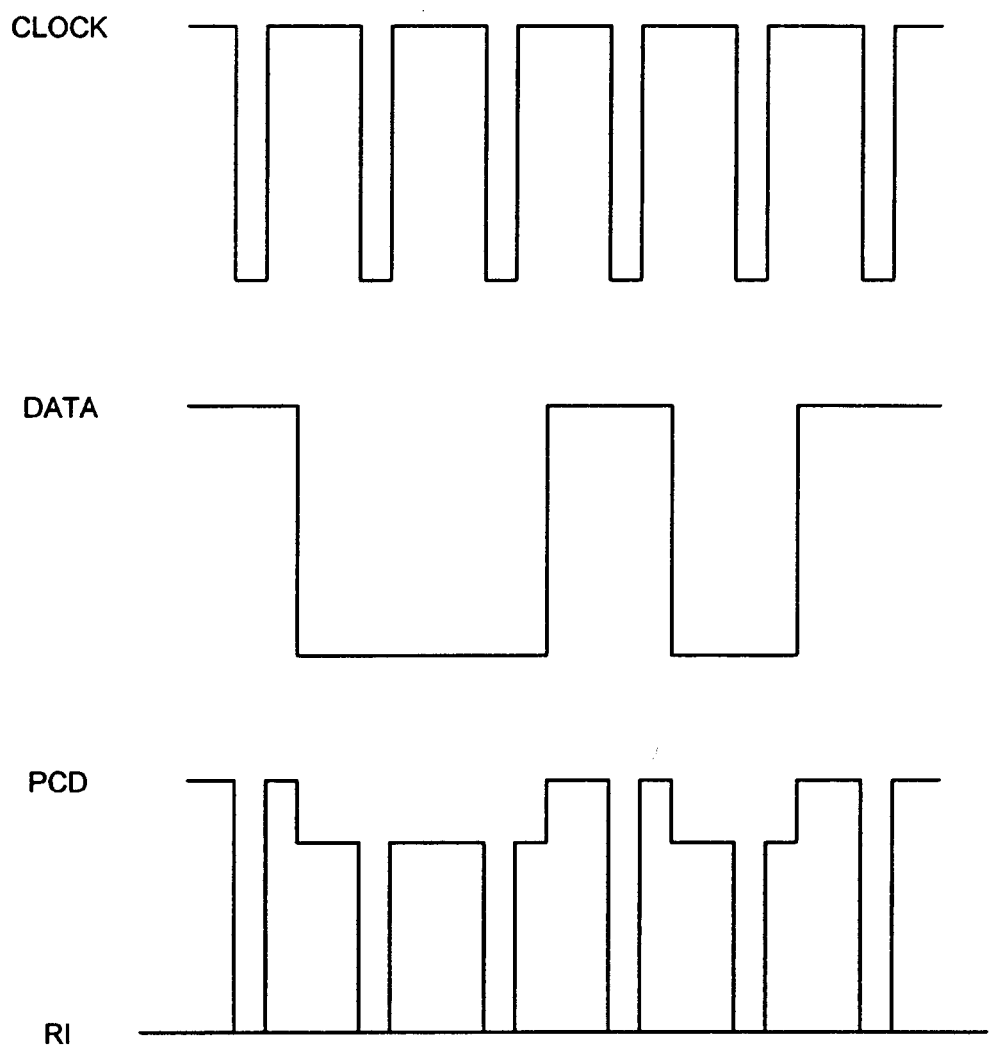
FIG. 3 is a timing diagram illustrating one method for transmitting data from a smart module to a wiring analyzer.

Referring to FIG. 3, a representative timing diagram illustrating data transmission from the smart module 12 to the wiring analyzer 14 is shown. Data transfer from the smart module 12 is clocked by a clock signal provided by the wiring analyzer 14. Upon receiving a clock pulse, a data bit representing a binary 1 is created by the smart module 12 by operating in a low power mode, thus allowing the PCD line to float high. A data bit representing a binary 0 may be created by the smart module 12 by turning on a visual indicator 30, which increases the power required by the smart module 12 and effectively clamps the PCD input to a low voltage with respect to RI. A data bit may be presented to the wiring analyzer 14 indefinitely until another clock pulse is issued by the wiring analyzer 14. As shown in FIG. 3, the wiring analyzer 14 provides power to the smart module 12 during both a data bit one and a data bit zero transmission from the smart module 12 to the wiring analyzer 14.

Figure 4:
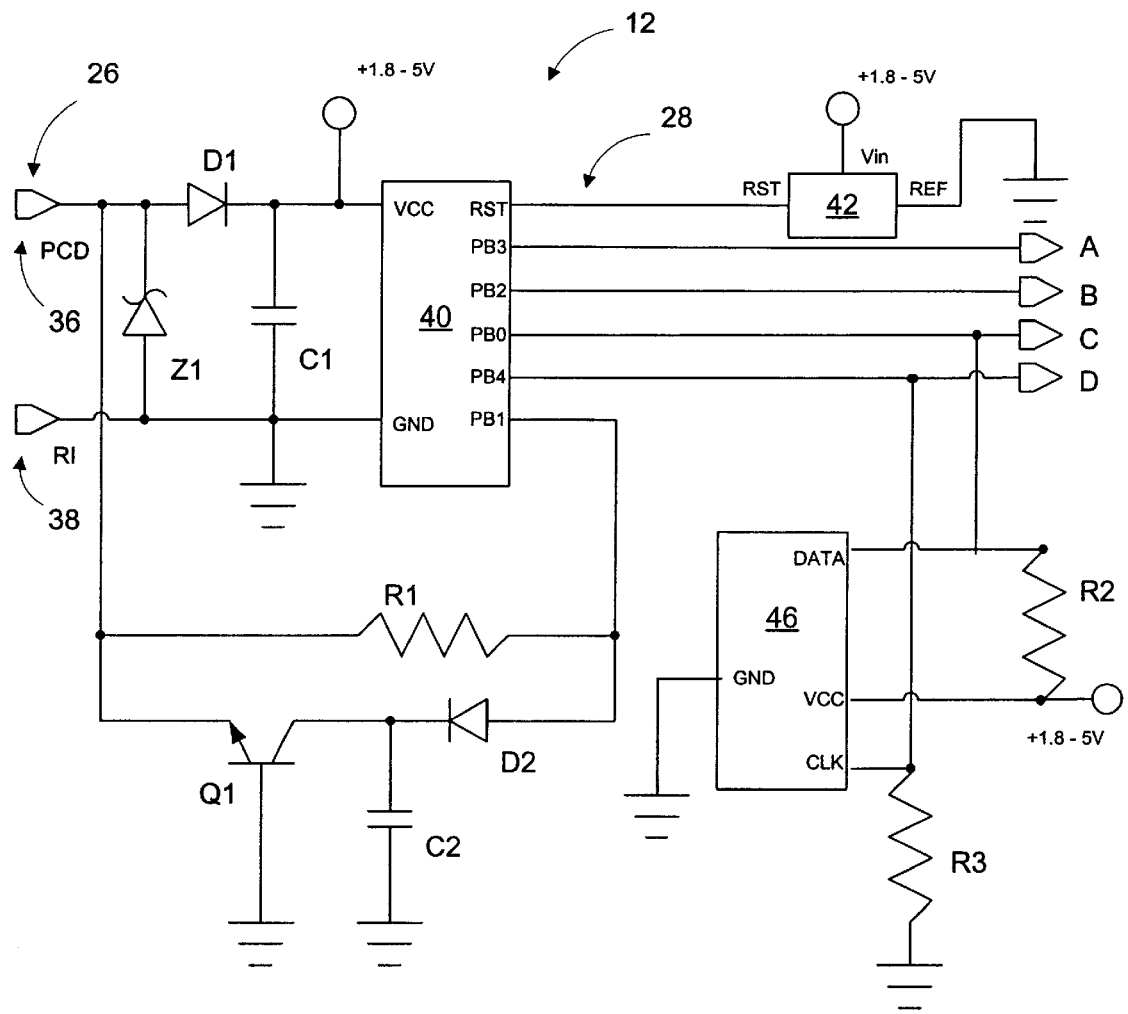
FIG. 4 is a schematic diagram illustrating an embodiment of a smart module.
Figure 4:
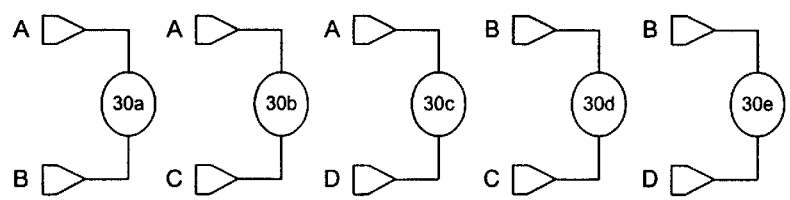

FIG. 4 is a schematic diagram of one embodiment of hardware components of a smart module 12. The smart module 12 is in communication with the wiring analyzer 14 through electrical connections 26 to enable a synchronous bi-directional communication protocol. The connections 26 include a PCD line 36 and a RI line 38. The wiring analyzer 14 includes a current source of five milliamperes or greater that couples to the lines 36, 38 to power the smart module 12.

The smart module 12 may include a zener diode Z1 that couples to the lines 36, 38 to limit the voltage to the smart module 12. The smart module 12 may further include a diode D1 that supplies power VCC from the PCD line 36 except during clock periods. The diode D1 is coupled to a capacitor C1, which may have a value of 0.1 microfarad, that provides power VCC. The smart module 12 further includes a processor 40 that is in electrical communication with the lines 36, 38. The PCD line 36 provides a power input to a VCC pin and the RI line 38 couples to a GND pin to provide a reference voltage. Pin references used herein are for exemplary purposes only and should not be construed as limiting the scope of the invention. A processor 40, as used herein, is any device that is capable of receiving and processing data. Those skilled in the art will appreciate that various types of processors and controllers may be incorporated into the smart module 12. The smart module 12 uses synchronous bi-directional communication which allows the use of a relatively inexpensive processor 40 with inconsistent clock rates. The processor 40 may also be embodied as a simple logic circuit with a timing circuit.

Loss of power to the processor 40 occurs when the PCD line 36 is common to the RI line 38 for an extended period of time. This may occur during an extended hold time on a clock pulse. The processor 40 may couple to a reset circuit 42 through a RST pin. The reset circuit 42 assures that the processor 40 is reset when the voltage VCC to the processor 40 drops below a specified threshold. The reset may occur within 2 ms of losing power to the PCD line 36. The reset circuit 42 couples to a power source and a reference ground.

The processor 40 is further in electrical communication with a memory 46. The memory 46 may be embodied as any number of nonvolatile data storage devices including EEPROM, flash memory, or the like. In the embodiment shown, the memory 46 is a 2k byte external memory. The memory 46 may also be disposed with the processor 40 on a single chip such as with a microcontroller. The memory 46 may be used to store information about the adapter 20 that is referred to herein as adapter data. The adapter data may include the usage count of the adapter, the maximum usage count of the adapter, an adapter signature which identifies the type of adapter, adapter description, pinout, default point labels, voltage rating, tare resistance, who created the adapter, last calibration date, calibration expiration date, and so forth. The adapter data may also include an image of the adapter such as a graphical image. Furthermore, where visual indicators 30 are used, the memory 46 lists the number of visual indicators 30 incorporated within the smart module 12 and what the visual indicators 30 may be used for.

The wiring analyzer 14 with the appropriate operating instructions is able to access and utilize any of the data stored in the memory 46. The wiring analyzer 14 is able to confirm that the adapter 20 is correct for the intended device to be tested. The memory 46 may also contain additional information, such as a serial number, to identify the adapter 20. As adapters 20 may share a common signature, a serial number allows a wiring analyzer 14 to identify between adapters 20. A serial number further allows for complete traceability of an adapter 20 for increased reliability testing.

Data stored in the memory 46 may be organized in an expandable structure to allow the addition of additional data that is deemed pertinent. Wiring analyzers 14 that do not understand new data fields in the memory 46 may ignore the data fields unless a revision flag is incremented stating that the new data structure contains vital information that is not to be ignored. As revisions may not require the revision flag to be incremented, reasonable forward and backward compatibility is provided.

The memory 46 may be coupled to the processor 40 in any number of ways as is well known in the art. In the embodiment shown, the memory 46 couples to a PB0 pin to receive data and a PB4 pin to receive clock signals. Once again, pin references are for exemplary purposes only and alternative pin names may be used. The PB0 and PB4 pins may further be used for powering visual indicators 30 to thereby reduce the number of pins required by the smart module 12. Resistors R2, R3 may be coupled to the memory 46 and to a power source and ground as shown. The resistors R2, R3 serve to preserve data integrity of the memory 46 during voltage transitions and while visual indicators 30 are lit.

In one embodiment, the processor 40 may also be in electrical communication with one or more visual indicators 30, such as LEDs. In the illustrated embodiment, five visual indicators 30a–e are used and coupled to the processor 40 as shown through pins A–D to enable selection. The visual indicators 30 a–e may be bicolor LEDs to provide further indication to an operator. The visual indicators 30 reflect conditions in the connector 22 or to electrical contacts of a device in communication with the connector 22. The wiring analyzer 14 sends commands to the smart module 12 to light visual indicators 30 in accordance with the conditions of the connector 22.

The wiring analyzer 14 can identify the presence of the smart module 12 initially by identifying it as a diode. The wiring analyzer 14 may then test the smart module 12 to see if the module 12 responds. The smart module 12 realizes a Clock as the falling edge of the voltage after the PCD line 36 has less than a specified voltage VCLKMAX with respect to the RI line 38. For the smart module 12 to receive data, the processor 40 first charges a capacitor C2, which may have a value of 0.01 uF. The capacitor C2 is in communication with the processor 40 through a pin, such as the PB1 pin. After charging the capacitor C2, the processor 40 waits for a clock pulse detected on the PB1 pin.

Approximately 50 microseconds after the falling edge of the clock pulse, the processor 40 samples the voltage on pin PB1. At this time, the clock pulse has ended and the PCD line 36 is supplying power to the smart module 12. If the wiring analyzer 14 sent a data bit 1, the capacitor C2 is still charged, and the processor 40 reads a data bit 1 on pin PB1 through resistor R1. This is because negligible current flows through diode D2. If the wiring analyzer 14 sends a data bit 0, then transistor Q1 turns on and drains the capacitor C2. The smart module 12 reads a data bit 0 through diode D2 and re-charges the capacitor C2 to be ready for the next data bit. No maximum time is specified between transmitted bits. A suggested maximum bit transmission rate for this example is 10 kilobits per second. A suggested clock and data pulse time is 10 microseconds.

Data transfer from the smart module 12 is clocked by a clock signal provided by the wiring analyzer 14. Upon receiving a clock pulse, a data bit representing a binary 1 is created by the smart module 12 by operating in a low power mode, thus allowing the PCD line 36 to float high. A data bit representing a binary 0 is created by the smart module 12 by turning on a visual indicator 30 which increases the power required by the smart module 12 and effectively clamps the PCD line 36 to a low voltage with respect to the RI line 38. The transmit time per bit is directly related to the value of the capacitor C1, since it takes time for the voltage to rise. In this implementation, data is presented to the PCD line 36 approximately 40 microseconds after the falling edge of the clock, and is readable by the wiring analyzer 14 approximately 50 microseconds later. A data bit will be held indefinitely until another clock pulse is sent, or power is removed.

In order to preserve the integrity of data bit 1, high-current functions, including programming the memory 46, may occur while the smart module 12 transmits a data bit 0 and the wiring analyzer 14 polls the smart module 12 to complete its operations. Visual indicators 30a–e may be turned on by the processor 40 by enabling the digital outputs to appropriate pins PB3, PB2, PB0, and PB4. Setting a selected pin high and another pin low lights a specified visual indicator 30a–e.

After the wiring analyzer 14 initially supplies a current source to the PCD line 36 with respect to the RI line 38, the smart module 12 turns on the last visual indicator 30 that the smart module 12 was instructed to light. The smart module 12 retains in memory 46 the status of the visual indicators 30 for this purpose. When a different visual indicator 30 is required, the wiring analyzer 14 sends a command to the smart module 12 to light a different visual indicator 30 or a different color on the lit visual indicator 30. Power is supplied by the wiring analyzer 14 until the smart module 12 informs the wiring analyzer 14 that the request is performed. The newly selected visual indicator 30 is turned on while the smart module 12 is recording the request. The wiring analyzer 14 can maintain the current and the visual indicator 30 will continue to be lit with no data transferred to the smart module 12. The next time power is supplied to the smart module 12, the new visual indicator 30 will be lit. The wiring analyzer 14 can stop supplying power to the smart module 12. In one embodiment, the smart module 12 may turn off within two milliseconds of power termination.

If the wiring analyzer 14 issues a clock pulse instead of removing power, the smart module 12 presents a data bit 1. Upon receiving a second clock pulse, the smart module 12 presents a data bit 0. From these two transmissions, the wiring analyzer 14 can identify an adequate threshold that may use hysteresis to distinguish subsequent data bits 0 and 1 from the smart module 12.

In an alternative embodiment, one of either of the PCD or RI lines 36, 38 may also be connected to the connector 22 and can be used in standard test functions of the wiring analyzer 14. Thus, incorporating the smart module 12 within the adapter 20 may only require one extra connection 24 from the adapter 20 to the wiring analyzer 14.

The present invention provides a smart module 12 that is incorporated within an adapter 20. The smart module 12 includes processing capability and a memory 46 to retain the adapter signature, usage count, pinout, maximum test voltage and other useful information. The smart module 12 allows a wiring analyzer 14 to automatically identify an adapter 20 and determine if the adapter 20 is correct for the device to be tested. This eliminates the problem of confusing adapters 20 with the same pin count. In a harness assembly, the wiring analyzer 14 is able to verify that the correct adapters 20 are in the correct positions. The visual indicators 30 provide effective feedback to an operator as to the conditions of the connector 22. The features of the present invention greatly facilitate adapter identification and overall testing procedures.

It should be appreciated that the apparatus and methods of the present invention are capable of being incorporated in the form of a variety of embodiments, only a few of which have been illustrated and described above. The invention may be embodied in other forms without departing from its spirit or essential characteristics. The described embodiments are to be considered in all respects only as illustrative and not restrictive of the scope of the invention.

What is claimed is:

1. A smart module apparatus for use within an adapter and for providing synchronous, bi-directional communication with a wiring analyzer, the module comprising:
    a first input for electrical communication with the wiring analyzer;
    a second input for electrical communication with the wiring; and
    a processor in electrical communication with the first and second inputs for receiving power, clock signal, bidirectional communication data, and an electrical reference from the wiring analyzer,
    wherein the processor receives power when not receiving a clock signal,
    wherein the processor receives a clock signal and a data bit zero when the first and second inputs have a reversed polarity for a time duration, and
    wherein the processor receives a clock signal and data bit one when the first and second inputs have a common voltage for a time duration.

2. The smart module apparatus of claim 1, wherein the processor receives power while transmitting a data bit signal through the first input to the wiring analyzer.

3. The smart module apparatus of claim 2, further comprising a memory in electrical communication with the processor and containing adapter data relating to the adapter, wherein the processor accesses the memory and provides adapter data to the wiring analyzer through the first input.

4. The smart module apparatus of claim 3, wherein the memory comprises an EEPROM.

5. The smart module apparatus of claim 3, wherein the memory comprises flash memory.

6. The smart module apparatus of claim 3, wherein the adapter data includes an adapter signature.

7. The smart module apparatus of claim 1, further comprising a visual indicator in electrical communication with the processor.

8. The smart module apparatus of claim 7, wherein the visual indicator is a LED.

9. The smart module apparatus of claim 7, further comprising a memory in electrical communication with the processor, and wherein the processor stores in the memory an indication of the status of the visual indicator.

10. A smart adapter for interfacing with a test device and a wiring analyzer, the smart adapter providing synchronous, bi-directional communication with the wiring analyzer, the adapter comprising:
    a plurality of connectors for providing electrical communication with the wiring analyzer;
    first and second smart module connectors for providing electrical communication with the wiring analyzer;
    a connector module, in electrical communication with the connectors, for providing an interface with a test device; and
    a smart module, in electrical communication with the first and second smart module connectors, the smart module including,
        a first input coupled to the first smart module connector,
        a second input coupled to the second smart module connector, and
        a processor in electrical communication with the first and second inputs for receiving power, clock signal, bidirectional communication data, and an electrical reference from the wiring analyzer,
        wherein the processor receives power when not receiving a clock signal,
        wherein the processor receives a clock signal and a data bit zero when the first and second inputs have a reversed polarity for a time duration, and
        wherein the processor receives a clock signal and data bit one when the first and second inputs have a common voltage for a time duration.

11. The smart adapter of claim 10, wherein the processor receives power while transmitting a data bit signal through the first input to the wiring analyzer.

12. The smart adapter of claim 11, wherein the smart module further includes a memory in electrical communication with the processor and containing adapter data relating to the adapter, wherein the processor accesses the memory and provides adapter data to the wiring analyzer through the first input.

13. The smart adapter of claim 12, wherein the memory comprises an EEPROM.

14. The smart adapter of claim 12, wherein the memory comprises flash memory.

15. The smart adapter of claim 12, wherein the adapter data includes an adapter signature.

16. The smart adapter of claim 10, wherein the smart module further includes a visual indicator in electrical communication with the processor.

17. The smart adapter of claim 16, wherein the visual indicator is a LED.

18. The smart adapter of claim 16, wherein the smart module further includes a memory in electrical communication with the processor, and wherein the processor stores in the memory an indication of the status of the visual indicator.

19. A method for providing adapter data relating to an adapter through synchronous, bi-directional communication to a wiring analyzer, the method comprising:

incorporating a smart module with the adapter, the smart module having first and second inputs in electrical communication with a processor;

placing the first and second inputs in electrical communication with the wiring analyzer to thereby enable transmission of power, clock signal, and bidirectional communication data from the wiring analyzer;

the processor receiving power when not receiving a clock signal;

the processor receiving a clock signal and data bit zero when the first and second inputs have a reversed polarity for a time duration; and the processor receiving a clock signal and data bit one when the first and second inputs have a common voltage for a time duration.

20. The method of claim 19, further comprising establishing a minimum hold time between clock signals and an indefinite maximum hold time between clock signals.

21. The method of claim 19, further comprising the processor receiving power while transmitting a data bit signal through the first input to the wiring analyzer.

22. The method of claim 21, wherein the smart module further comprises a memory in electrical communication with the processor.

23. The method of claim 22, further comprising storing adapter data relating to the adapter in the memory.

24. The method of claim 23, wherein the adapter data includes an adapter name.

25. The method of claim 23, wherein the adapter data includes a graphic representative of the adapter.

26. The method of claim 23, wherein the adapter data includes a usage count.

27. The method of claim 23, wherein the adapter data includes a maximum usage count.

28. The method of claim 23, wherein the adapter data includes an adapter signature identifying the adapter type.

29. The method of claim 23, wherein the adapter data includes a calibration date.

30. The method of claim 23, wherein the adapter data includes a tare resistance.

31. The method of claim 22, wherein the memory comprises an EEPROM.

32. The method of claim 22, wherein the memory comprises flash memory.

33. The method of claim 19, wherein the smart module further includes a visual indicator in electrical communication with the processor and further comprising:

the wiring analyzer instructing the processor to light the visual indicator; and the processor lighting the visual indicator in response to the wiring analyzer.

34. The method of claim 33, wherein the visual indicator is a LED.

35. The method of claim 33, wherein the smart module further comprises a memory in electrical communication with the processor and further comprising, the processor storing in the memory an indication of the status of the visual indicator.

* * * * *